US007254055B2

United States Patent
Cho et al.

(10) Patent No.: US 7,254,055 B2
(45) Date of Patent: Aug. 7, 2007

(54) INITIAL FIRING METHOD AND PHASE CHANGE MEMORY DEVICE FOR PERFORMING FIRING EFFECTIVELY

(75) Inventors: Beak-hyung Cho, Hwaseong-si (KR); Du-eung Kim, Yongin-si (KR); Choong-keun Kwak, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 128 days.

(21) Appl. No.: 10/929,511

(22) Filed: Aug. 30, 2004

(65) Prior Publication Data

US 2005/0052904 A1    Mar. 10, 2005

(30) Foreign Application Priority Data

Sep. 8, 2003    (KR)    ............... 10-2003-0062546

(51) Int. Cl.
- *G11C 11/00*    (2006.01)
- *G11C 8/00*    (2006.01)
- *G11C 29/00*    (2006.01)
- *G11C 8/12*    (2006.01)
- *G11C 8/04*    (2006.01)

(52) U.S. Cl. ............... 365/163; 365/201; 365/230.03; 365/230.06; 365/239

(58) Field of Classification Search ............... 365/163, 365/201, 230.03, 230.06, 239
See application file for complete search history.

(56) References Cited

U.S. PATENT DOCUMENTS 4,477,884 A * 10/1984 Iwahashi et al. ....... 365/185.33

5,805,514 A * 9/1998 Iwakiri ................... 365/201
6,430,096 B1 * 8/2002 Grass .................... 365/201
6,809,401 B2 * 10/2004 Nishihara et al. ........... 257/613

FOREIGN PATENT DOCUMENTS

KR    98-28731    7/1998

* cited by examiner

*Primary Examiner*—J. H. Hur
(74) *Attorney, Agent, or Firm*—Mills & Onello, LLP

(57) ABSTRACT

In a firing method of a phase change memory device and a phase change memory capable of effectively performing a firing operation, the phase change memory device includes a plurality of memory cell array blocks, a counter clock generation unit, a decoding unit, and a driving unit. Each memory cell array block has phase change memory cells. The counter clock generation unit outputs first through third counter clock signals in response to an external clock signal and a firing mode signal, wherein the first through third counter clock signals have different cycles. The decoding unit, in response to the first through third counter clock signals, outputs a block address which selects one of the plurality of memory cell array blocks, word line addresses which enable word lines of the selected memory cell array block, and a redundant word line address which enables a redundant word line of the selected memory cell array block. The driving unit applies a firing current to the memory cell array blocks in response to the firing mode signal. According to the phase change memory device and the initial firing method, the time taken to perform the initial firing operation can be reduced. In addition, since the numbers of the needed signals are minimized, a large number of chips on a single wafer can be simultaneously tested.

6 Claims, 5 Drawing Sheets

INITIAL FIRING METHOD AND PHASE CHANGE MEMORY DEVICE FOR PERFORMING FIRING EFFECTIVELY

This application claims the priority of Korean Patent Application No. 2003-62546, filed on Sep. 8, 2003, in the Korean Intellectual Property Office, the contents of which are incorporated herein in their entirety by reference.

BACKGROUND OF THE INVENTION

1. Field of the Invention

The present invention relates to an initial firing method and a phase change memory device, and more particularly, to an initial firing method and a phase change memory device capable of effectively performing an initial firing operation in order to perform a stable read-out operation.

2. Description of the Related Art

An "initial firing" operation is an operation for initially applying a high current to a phase change memory device having phase change materials after its production. The initial firing generates sufficient heat at a contact interface between the phase change materials, so that the phase change materials have a uniform resistance distribution.

FIG. 1 is a view illustrating a set resistance distribution of a phase change material before it is subjected to the initial firing operation Referring to FIG. 1, in the range (i), the set resistance values are widely distributed and the average set resistance value is high. Therefore, at the time of the read-out operation, defects may occur, and thus, the yield may be reduced.

FIG. 2 is a view illustrating the set resistance distribution of a phase change material after it is subjected to the initial firing operation.

Referring to FIG. 2, in the range (ii), the set resistance values are narrowly and uniformly distributed and the average set resistance value is lower than that of the phase change material before it is subjected to the initial firing operation.

The initial firing operation is needed in order to perform the stable read-out operation of the phase change memory device. The initial firing operation is a mandatory test operation that is performed on a wafer only once.

Conventionally, the initial firing operation is performed on each phase change memory cell individually. Therefore, there is a problem that, as the number of phase change memory cells on the wafer increases, testing becomes more time-consuming.

SUMMARY OF THE INVENTION

The present invention provides a phase change memory device capable of simultaneously performing initial firing operations on a plurality of phase change memory cells.

The present invention also provides a method of simultaneously performing initial firing operations on a plurality of phase change memory cells.

According to an aspect of the present invention, there is provided an initial firing method of a phase change memory device having a phase change material, the method comprising the steps of: (a) selecting one of a plurality of memory array blocks; (b) sequentially enabling word lines of the selected memory cell array block; and (c) applying a firing current to bit lines of the selected memory cell array block.

In one embodiment, the firing current is larger than a reset current, which allows the phase change material to be in a reset state.

In one embodiment, step (a) comprises the steps of: (a1) decoding a block address in response to an external clock signal and a firing mode signal; and (a2) selecting one of the memory cell array blocks in response to the decoded block address.

In one embodiment, the firing mode signal is a signal which is enabled at the time of the initial firing operation of the phase change memory device. All of the bit lines including redundant bit lines can be enabled when the memory cell array block is selected.

In one embodiment, step (b) comprises the steps of: (b1) sequentially enabling word line addresses from the least significant bit to the most significant bit thereof in response to an external clock signal and a firing mode signal; and (b2) enabling word lines in response to the sequentially enabled word line addresses. In one embodiment, the redundant word line is enabled after all the normal word lines are enabled.

According to another aspect of the present invention, there is provided a phase change memory device comprising a plurality of memory cell array blocks, a counter clock generation unit, a decoding unit, and a driving unit. Each memory cell array block has phase change memory cells. The counter clock generation unit outputs first through third counter clock signals in response to an external clock signal and a firing mode signal, wherein the first through third counter clock signals have different cycles. The decoding unit, in response to the first through third counter clock signals, outputs a block address which selects one of the plurality of memory cell array blocks, word line addresses which enable word lines of the selected memory cell array block, and a redundant word line address which enables a redundant word line of the selected memory cell array block. The driving unit applies a firing current to the memory cell array blocks in response to the firing mode signal.

In one embodiment, the counter clock generation unit comprise first through n-th row counters, a redundant counter, and first through m-th column counters. The first through n-th row counters are turned on or off in response to the firing mode signal and generate first through n-th row counter clock signals in response to the external clock signal, wherein the first through n-th row counter clock signals constitute the first counter clock signal. The redundant counter is turned on or off in response to the firing mode signal and generates the second counter clock signal in response to the external clock signal. The first through m-th column counters are turned on or off in response to the firing mode signal and generate first through m-th column counter clock signals in response to the external clock signal, wherein the first through m-th column counter clock signals constitute the third counter clock signal.

In one embodiment, the second through n-th row counters are sequentially operated in response to the carry output from the previous row counter. The redundant counter can be operated in response to the carry output from the n-th row counter. The first column counter can be operated in response to the carry output from the redundant counter, and the second to m-th column counters can be sequentially operated in response to the previous column counter.

In one embodiment, the first through third counter clock signals are sequentially generated, the first through n-th row counter clock signals constituting the first counter clock signal can be sequentially generated, and the first through m-th column counter clock signals constituting the third counter clock signal can be sequentially generated.

In one embodiment, the cycles of the first through n-th row counter clock signals can be sequentially doubled, the cycle of the second counter clock signal can be twice as long as that of the n-th row counter clock signal, the cycle of the first column counter clock signal can be twice as long as that of the second counter clock signal, and the cycles of the second to m-th counter clock signals can be sequentially doubled.

The decoding unit can comprise: a row decoder, which outputs the word line addresses which are sequentially enabled in response to the first counter clock signal; a redundant decoder, which outputs the redundant word line address in response to the second counter clock signal; and a column decoder, which outputs the block address which selects one of the plurality of memory cell array blocks in response to the third counter clock signal.

The driving unit can comprise a plurality of transistors, each of which has a first terminal connected to a firing voltage, a second terminal connected to the bit lines of the memory cell array blocks, and a gate connected to the firing mode signal.

The driving unit can further comprise a control unit, which controls the firing current to be applied to only the bit lines of the phase change memory cell array, which are selected by the block address, in response to the block address and the firing mode signal.

In one embodiment, the control unit comprises a NAND gate. In one embodiment, the control unit consists of a NAND gate.

In one embodiment, the firing voltage is equal to or higher than a power supply voltage. In one embodiment, the firing current is larger than a reset current, which allows the phase change material to be in a reset state

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
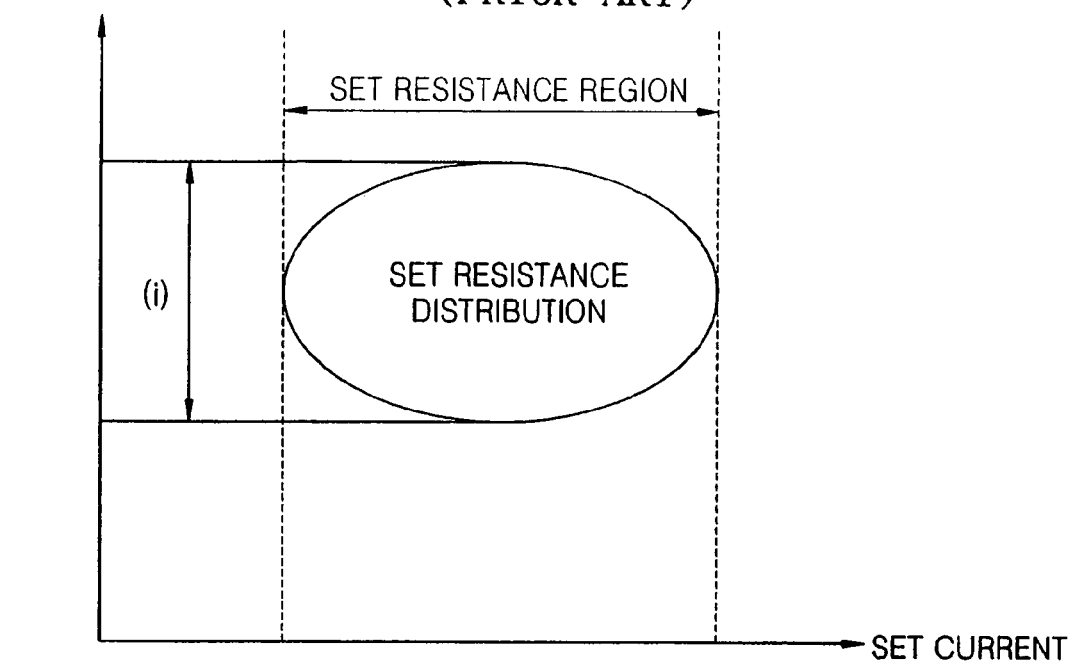
FIG. 1 is a diagram illustrating a set resistance distribution of a phase change material before it is subjected to an initial firing operation.
Figure 2:
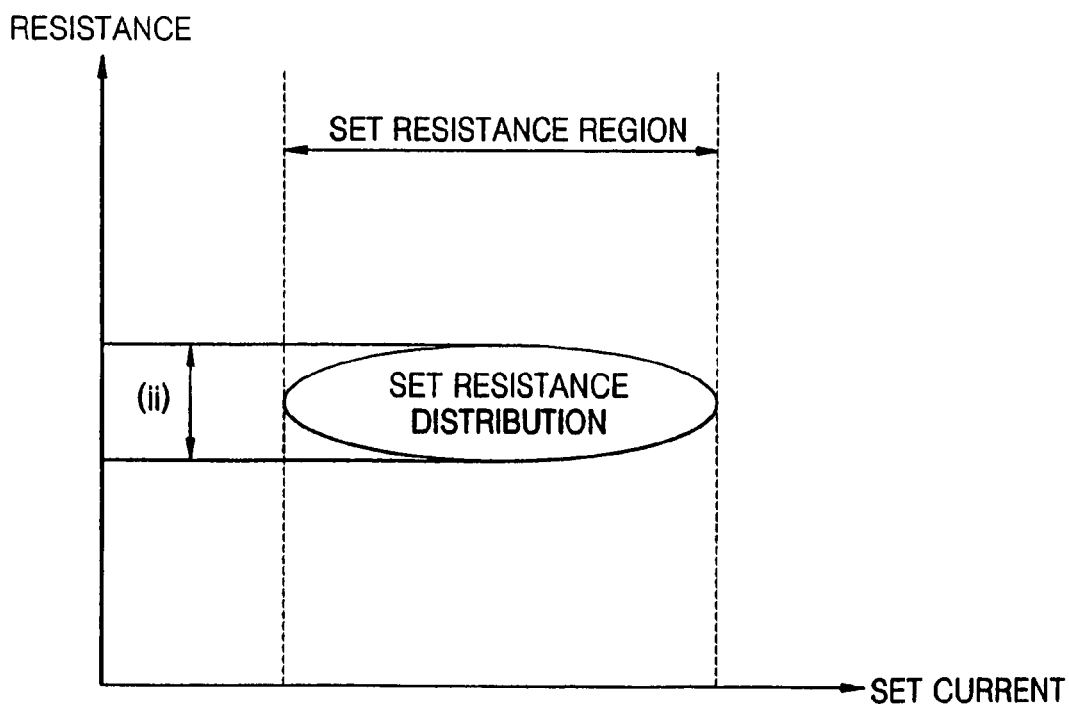
FIG. 2 is a diagram illustrating a set resistance distribution of a phase change material after it is subjected to an initial firing operation.
Figure 3:
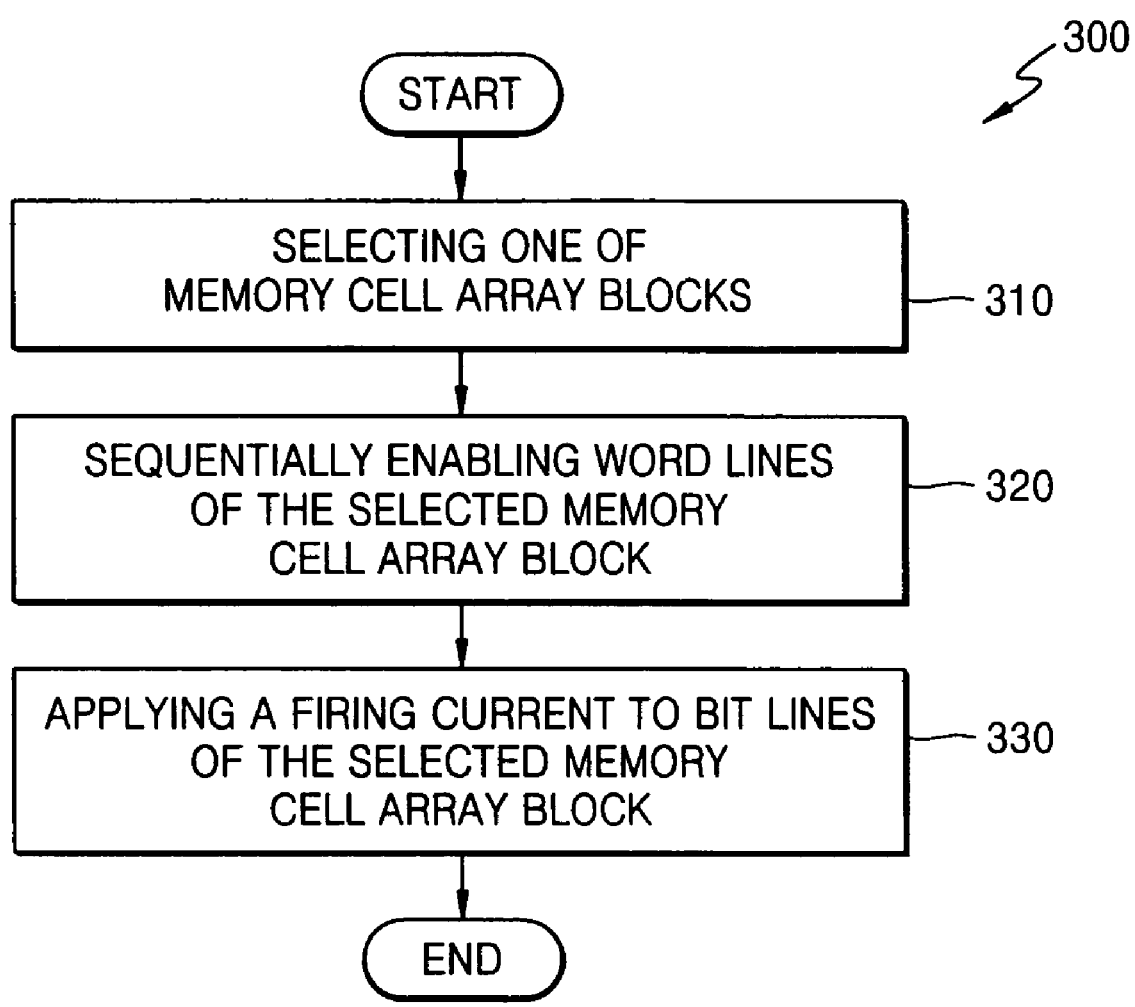
FIG. 3 is a flowchart illustrating an initial firing method according to an embodiment of the present invention.

FIG. 3 is a flowchart illustrating an initial firing method according to an embodiment of the present invention.

Referring to FIG. 3, the initial firing method 300 of the phase change memory device having the phase change material, according to the embodiment of the present invention, comprises a step 310 of selecting one of a plurality of memory array blocks; a step 320 of sequentially enabling word lines of the selected memory cell array block; and a step 330 of applying a firing current to bit lines of the selected memory cell array block. The firing current is larger than a reset current, which allows the phase change material to be in a reset state.

Figure 4:
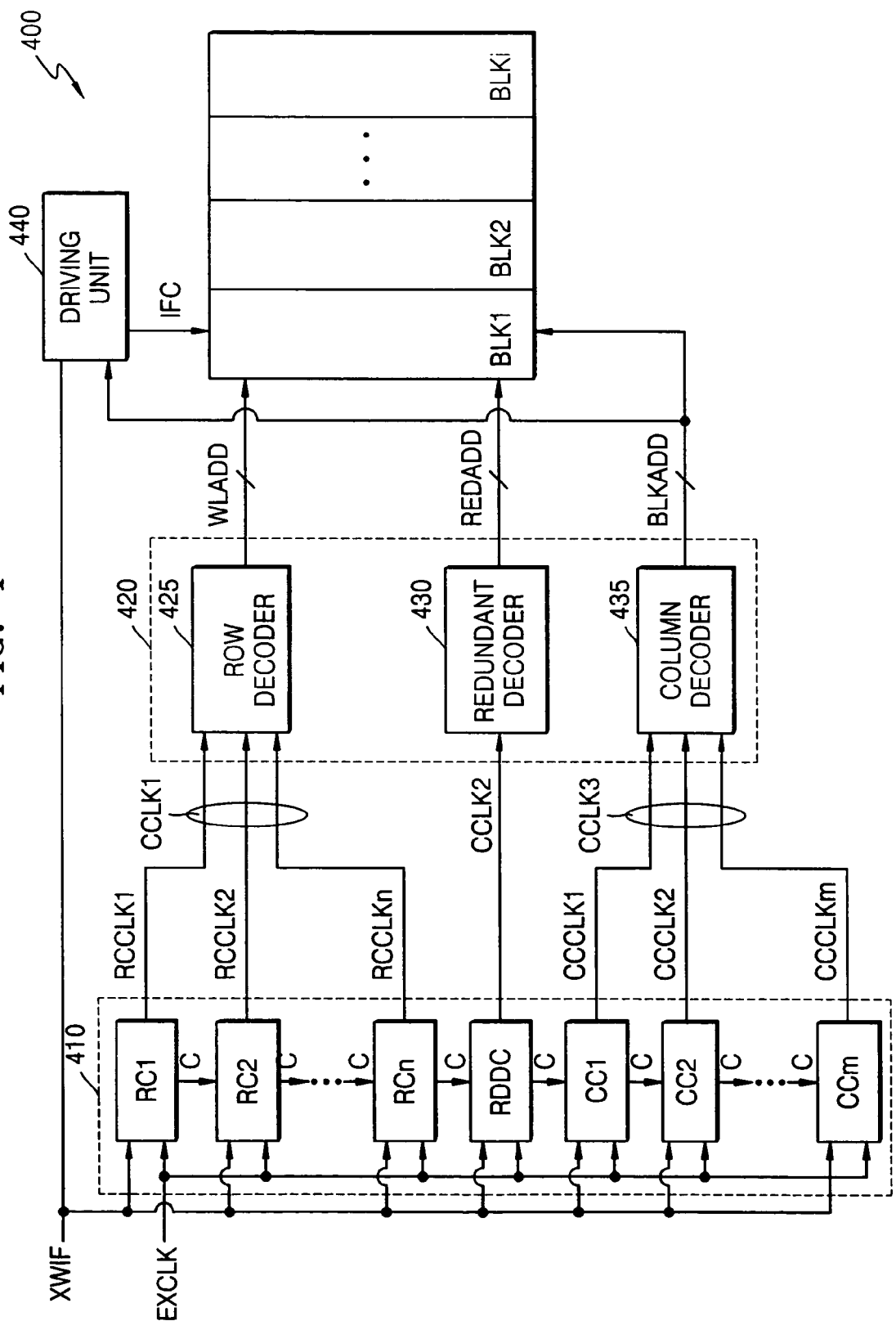
FIG. 4 is a block diagram illustrating a phase change memory device according to the present invention.

FIG. 4 is a block diagram illustrating one embodiment of the phase change memory device 400 according to the present invention.

Referring to FIG. 4, the phase change memory device 400 comprises a plurality of memory cell array blocks BLK1, and BLK2 through BLKi, a counter clock generation unit 410, a decoding unit 420, and a driving unit 440.

Each memory cell array block BLK1, and BLK2 through BLKi comprises phase change memory cells. The counter clock generation unit 410 outputs first through third counter clock signals CCLK1, CCLK2, and CCLK3 in response to an external clock signal EXCLK and a firing mode signal XWIF, wherein the first through third counter clock signals CCLK1, CCLK2, and CCLK 3 have different cycles.

The decoding unit 420, in response to the first through third counter clock signals CCLK1, CCLK2, and CCLK3, outputs a block address BLKADD which selects one of the plurality of memory cell array blocks BLK1, and BLK2 through BLKi, a word line address WLADD which enables word lines of the selected memory cell array block, and a redundant word line address REDADD which enables a redundant word line of the selected memory cell array block.

The driving unit 440 applies a firing current IFC to the memory cell array blocks BLK1, and BLK2 through BLKi in response to the firing mode signal XWIF.

The phase change memory device and the initial firing method according to the embodiment of the present invention will be described with reference to FIGS. 3 and 4.

The memory cell array blocks BLK1, and BLK2 through BLKi in the phase change memory device 400 comprise a plurality of phase change memory cells (not shown). The counter clock generation unit 410 outputs the first through third counter clock signals CCLK1, CCLK2, and CCLK 3 in response to the external clock signal EXCLK and the firing mode signal XWIF, wherein the first through third counter clock signals CCLK1, CCLK2, and CCLK 3 have different cycles.

The external clock signal EXCLK, a clock signal having a predetermined cycle, is input from the exterior and activated only at the initial firing mode when the initial firing operation is performed. The firing mode signal XWIF is generated at the time that the phase change memory device 400 is at the initial firing mode.

The counter clock generation unit 410 comprises a plurality of counters. The outputs of the counters are decoded to sequentially select the memory cell array blocks BLK1, and BLK2 through BLKi, so that the initial firing operation can be performed.

The counter clock generation unit 410 comprises the first through n-th row counters RC1, and RC2 through RCn, the redundant counter RDDC, and the first through m-th counters CC1, and CC2 through CCm.

The first through n-th row counters RC1, and RC2 through RCn are turned on or off in response to the firing mode signal XWIF and generate the first through n-th row counter clock signals RCCLK1, and RCCLK2 through RCCLKn in response to the external clock signal EXCLK, wherein the first through n-th row counter clock signals RCCLK1, and RCCLK2 through RCCLKn constitute the first counter clock signal CCLK1.

The redundant counter RDDC is turned on or off in response to the firing mode signal XWIF and generates the second counter clock signal CCLK2 in response to the external clock signal EXCLK. The first through m-th column counters CC1, and CC2 through CCm are turned on or off in response to the firing mode signal XWIF and generate the first through m-th column counter clock signals CCCLK1, and CCCLK2 through CCCLKm in response to the external clock signal EXCLK, wherein the first through m-th column counter clock signals CCCLK1, and CCCLK2 through CCCLKm constitute the third counter clock signal CCLK3.

The second through n-th row counters RC2 through RCn are sequentially operated in response to the carry C output from the previous row counter. The redundant counter RDCC is operated in response to the carry C output from the n-th row counter RCn. The first column counter CC1 is operated in response to the carry C output from the redundant counter RDDC. The second to m-th column counters CC2 through CCm are sequentially operated in response to the carry output C from the previous column counter.

Figure 6:
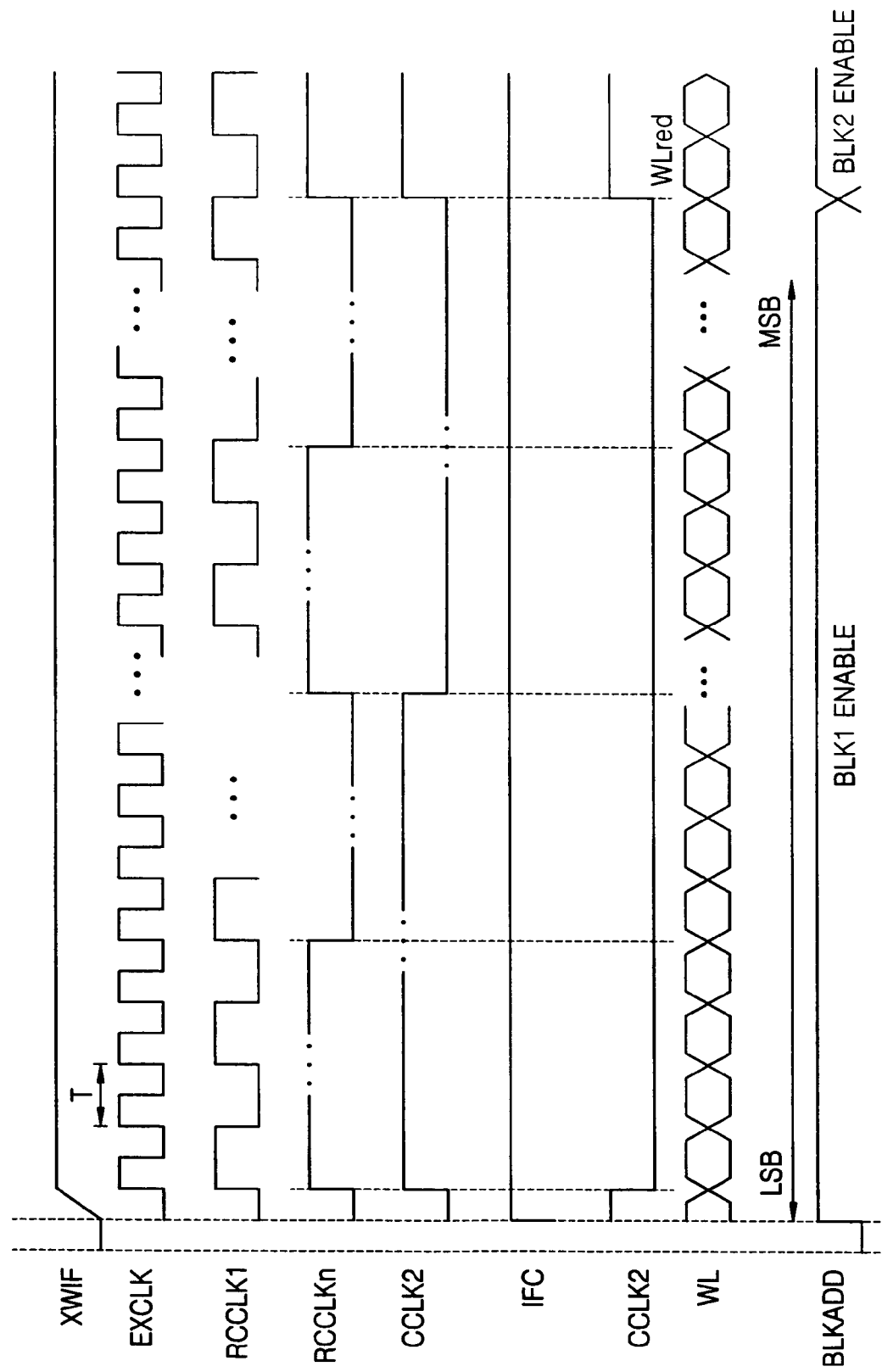
FIG. 6 is a timing diagram illustrating operation of the phase change memory device of FIG. 4.

The operation of the counter clock generation unit 410 will be described in detail with reference to the timing diagram of FIG. 6. FIG. 6 is a timing diagram illustrating operations of the phase change memory device of FIG. 4

The first through n-th row counters RC1, and RC2 through RCn, the redundant counter RDDC, and the first through m-th column counters CC1, and CC2 through CCm perform their own counting operations in response to the external clock signal EXCLK and the firing mode signal XWIF. If the firing mode signal XWIF is disabled, counters of the counter clock generation unit 410 are also turned off.

In addition, the second row counter RC2 is operated in response to the carry C generated by the first row counter RC1. The third row counter RC3 is operated in response to the carry C generated by the second row counter RC2. The redundant counter RDDC is operated in response to the carry C generated by the n-th row counter RCn.

In addition, the first column counter CC1 is operated in response to the carry C generated by the redundant counter RDDC. Similarly, the m-th column counter CCm is operated in response to the carry C generated by the (m−1)-th column counter (not shown). In this manner, the counters of the counter clock generation unit 410 are sequentially operated.

As shown in FIG. 6, cycles of the signals generated from the counters of the counter clock generation unit 410 are sequentially doubled. That is, the cycles of the first through n-th row counter clock signals RCCLK1, and RCCLK2 through RCCLKn output from the first through n-th row counters RC1, and RC2 through RCn are sequentially doubled.

The cycle of the second counter clock signal CCLK2 output from the redundant counter RDDC is twice as long as that of the n-th row counter clock signal RCCLKn output from the n-th row counter RCn. The cycle of the first column counter clock signal CCCLK1 output from the first column counter CC1 is twice as long as that of the second counter clock signal CCLK2 output from the redundant counter clock signal RDDC. Similarly, the cycles of the second to m-th counter clock signals CCCLK2 through CCCLKm are sequentially doubled.

Accordingly, the first through third counter clock signals CCLK1, CCLK2, and CCLK3 are sequentially generated.

The first through third counter clock signals CCLK1, CCLK2, and CCLK3 are input to the decoding unit 420.

The decoding unit 420, in response to the first through third counter clock signals CCLK1, CCLK2, and CCLK3, outputs the block address BLKADD which selects one of the plurality of memory cell array blocks BLK1, and BLK2 through BLKi, the word line addresses WLADD which enables word lines of the selected memory cell array block, and the redundant word line address REDADD which enables a redundant word line of the selected memory cell array block.

The decoding unit 420 comprises a row decoder 425, a redundant decoder 430, and a column decoder 435. The row decoder 425 outputs the word line addresses WLADD which are sequentially enabled in response to the first counter clock signal. That is, the row decoder 425 receives and decodes the first through n-th row counter clock signals RCCLK1, and RCCLK2 through RCCLKn having different cycles and outputs the decoding results as the word lines addresses WLADD.

The word line addresses WLADD sequentially enable word lines of the selected memory cell array block from the least significant bit to the most significant bit.

The redundant decoder 425 outputs the redundant word line address REDADD in response to the second counter clock signal CCLK2. The column decoder 435 outputs the block address BLKADD which selects one of the plurality of memory cell array blocks BLK1, and BLK2 through BLKi in response to the third counter clock signal CCLK3. That Is, the column decoder 435 receives and decodes the first through m-th column counter clock signals CCCLK1, and CCCLK2 through CCCLKm having different cycles, and outputs the decoding results as the block address BLKADD.

The block address BLKADD enables all the bit lines of the selected memory cell array block. Various types of structures of the decoding unit 420 for receiving and decoding the clock signals output from the counter clock generation unit 410 may be employed.

The driving unit 440 applies a firing current IFC to the memory cell array blocks BLK1, and BLK2 through BLKi in response to the firing mode signal XWIF. The operation of the driving unit 400 will be described with reference to FIG. 5.

Figure 5:
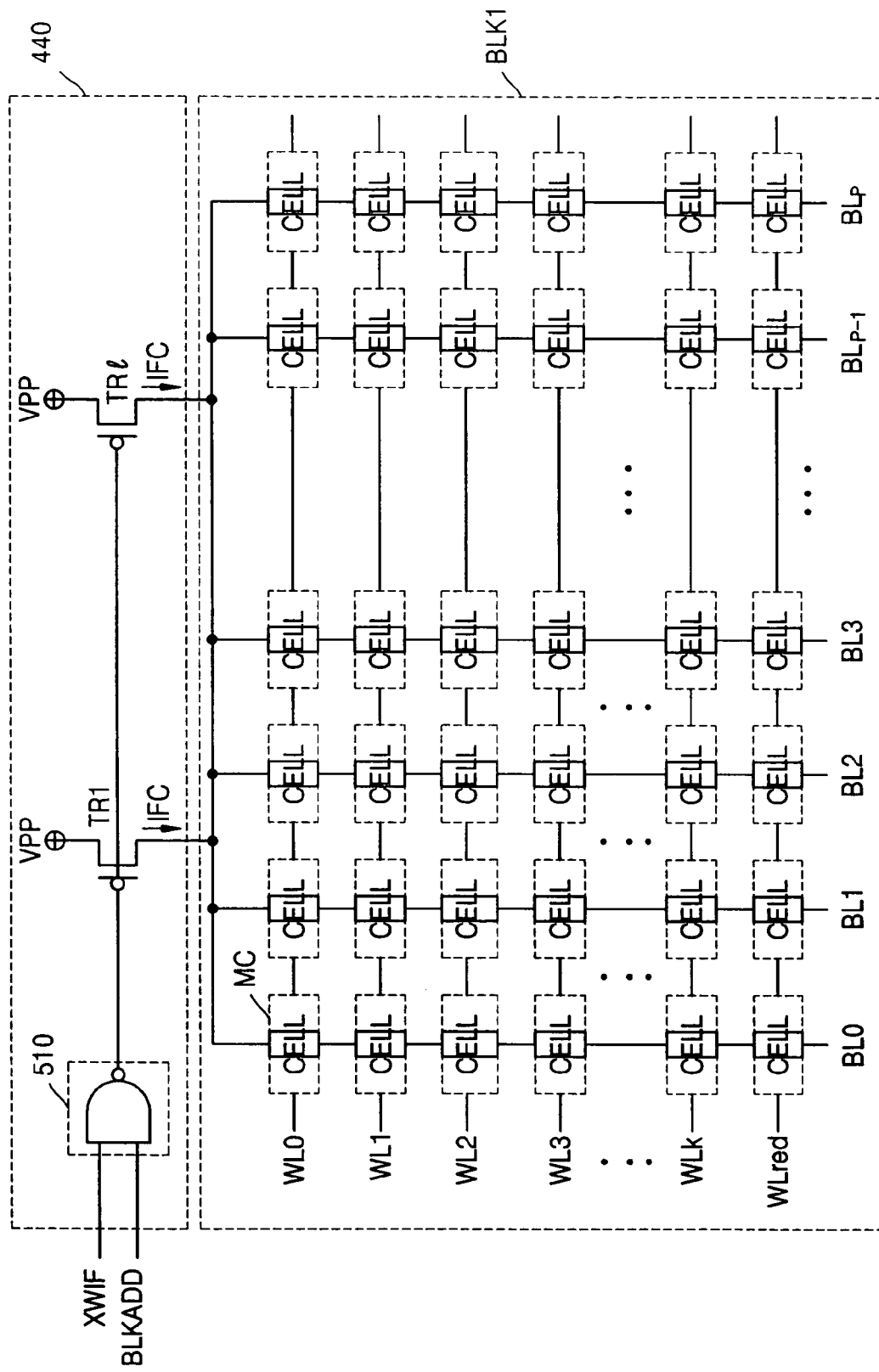
FIG. 5 is a schematic diagram illustrating a driving unit of FIG. 4.

FIG. 5 is a block diagram illustrating the driving 440 unit of FIG. 4. Referring to FIG. 5, the driving unit 440 comprises a plurality of transistors TR1 through TRl. Each transistor has a first terminal connected to a firing voltage VPP, a second terminal connected to the bit lines BL0, and BL1 through BLp of the memory cell array blocks BLK1, and BLK2 through BLKi, and a gate connected to the firing mode signal XWIF.

Each of the transistors TR1 through TRl has such suitable size that the firing current IFC can be applied to the bit lines BL0, and BL1 through BLp.

FIG. 5 illustrates only the first memory cell array block BLK1 having (k+1) word lines, (p+1) bit lines, and one redundant word line WLred.

At the initial firing operation, the first memory cell array block BLK1 is automatically selected by the block address BLKADD. The row decoder 425, which receives the clock signal CCLK1, outputs the word line addresses WLADD to sequentially enable the word lines WL0, and WL1 through WLk of the first memory cell array block BLK1.

That Is, the first word line WL0 is enabled first. The driving unit 440 applies the firing current IFC to the bit lines BL0, and BL1 through BLp of the first memory cell array block BLK1. The initial firing operation is then performed on the phase change materials of the memory cells that are connected to the first word line WL0.

Next, the first word line WL0 is disabled and the second word line WL1 is enabled. The initial firing operation is then performed on the phase change materials of the memory cells that are connected to the second word line WL0.

Similarly, the initial firing operations are performed on the phase change materials of the memory cells which are connected to the k-th word line WLk and the redundant word line WLred. As a result, the initial firing operation on the first memory cell array block is completed.

Since the first through n-th row counters RC1, and RC2 through RCn and the redundant counter RDDC of the counter clock generation unit 410 are sequentially operated to sequentially output the first through n-th row counter clock signals RCCLK1, and RCCLK2 through RCCLKn and the second counter clock signal CCLK2, the first through k-th word lines WL0, and WL1 through WLk and the redundant word line WLred are sequentially enabled.

If the redundant word line WLred is disabled, the column decoder 435 outputs the block address BLKADD by the operations of the first through m-th column counters CC1, and CC2 through CCm, and the block address BLKADD selects the second memory cell array block BLK2. This can be seen in the timing diagram of FIG. 6.

If the second memory cell array block BLK2 is selected, the first through n-th word lines (not shown) and the redundant word, line (not shown) are sequentially enabled, and the firing operation is performed.

The firing voltage VPP is equal to or higher than a power supply voltage. The voltage level may be increased or decreased in consideration of the number of connected memory cell arrays.

The firing current IFC is larger than the reset current, which allows the phase change material of the phase change memory device to be in a reset state.

The driving unit 440 may further comprises a control unit 510, which controls the firing current IFC to be applied to only the bit lines of the phase change memory cell array, which are selected by the block address BLKADD, in response to the block address BLKADD and the firing mode signal XWIF.

That is, since the firing current IFC is applied to only the selected memory cell array blocks, the firing operation is performed more accurately. The control unit 510 may be a NAND gate.

The output of the NAND gate is at a low level and the transistors TR1 through TRl are turned on, only when both the block address BLKADD and the firing mode signal XWIF are enabled to be at high levels. Although they are illustrated as PMOS transistors, the transistors TR1 through TRl need not be PMOS transistors.

In the phase change memory device 400 according to the present invention, since the externally input signals are minimized as the external clock signal EXCLK, the firing mode signal XWIF, the firing voltage VPP, the power supply voltage and the ground voltage, a large number of chips on a single wafer can be simultaneously tested.

As described above, according to the phase change memory device and the initial firing method of the present invention, it is advantageous that the time taken to perform the initial firing operation can be reduced. In addition, since the number of needed signals is minimized, it is advantageous that a large number of chips on a single wafer can be simultaneously tested.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An initial firing method of a phase change memory device having a phase change material, the method comprising the steps of:
    (a) selecting one of a plurality of memory cell array blocks;
    (b) sequentially enabling word lines of the selected memory cell array block; and
    (c) applying a firing current to bit lines of the selected memory cell array block, thereby simultaneously performing initial firing operations on a plurality of phase change memory cells, wherein the firing current is larger than a reset current, which allows the phase change material to be in a reset state.

2. The initial firing method according to claim 1, wherein the step (a) comprises the steps of:
    (a1) decoding a block address in response to an external clock signal and a firing mode signal; and
    (a2) selecting one of the memory cell array blocks in response to the decoded block address.

3. The initial firing method according to claim 2, wherein the firing mode signal is a signal which is enabled at the time of the initial firing operation of the phase change memory device.

4. The initial firing method according to claim 2, wherein all the bit lines including a redundant bit line are enabled when the memory cell array block is selected.

5. The initial firing method according to claim 1, wherein the step (b) comprises the steps of:
    (b1) sequentially enabling word line addresses from the least significant bit to the most significant bit thereof in response to an external clock signal and a firing mode signal; and
    (b2) enabling word lines in response to the sequentially enabled word line addresses.

6. The initial firing method according to claim 5, wherein the redundant word lines are enabled after all the normal word lines are enabled.

* * * * *